(12) United States Patent
Nussbaum et al.

(10) Patent No.: US 8,384,478 B2
(45) Date of Patent: Feb. 26, 2013

(54) VERSATILE AUDIO POWER AMPLIFIER

(75) Inventors: Michael Nussbaum, Newton, MA (US);
Timothy Sheen, Brighton, MA (US);
Daniel S. Pearce, Worcester, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 13/227,764

(22) Filed: Sep. 8, 2011

(65) Prior Publication Data
US 2012/0230519 A1 Sep. 13, 2012

Related U.S. Application Data

(63) Continuation-in-part of application No. 13/160,806, filed on Jun. 15, 2011, which is a continuation of application No. 12/717,198, filed on Mar. 4, 2010, now Pat. No. 7,986,187.

(51) Int. Cl.
*H03F 3/217* (2006.01)
(52) U.S. Cl. .................... 330/251; 330/207 A
(58) Field of Classification Search ............. 330/10, 330/207 A, 251
See application file for complete search history.

(56) References Cited

U.S. PATENT DOCUMENTS

| 4,253,079 | A | 2/1981 | Brosh |
| 5,319,342 | A | 6/1994 | Kuroki |
| 5,982,264 | A | 11/1999 | Nakao et al. |
| 6,369,685 | B1 | 4/2002 | Milavec et al. |
| 6,628,531 | B2 | 9/2003 | Dadafshar |
| 7,161,428 | B2 * | 1/2007 | Mendenhall ............... 330/251 |
| 7,332,993 | B1 | 2/2008 | Nussbaum |
| 7,432,793 | B2 | 10/2008 | Nussbaum |
| 7,433,207 | B2 | 10/2008 | Thor et al. |
| 7,889,041 | B2 | 2/2011 | Minteer |
| 7,986,187 | B1 | 7/2011 | Nussbaum et al. |
| 2002/0070835 | A1 | 6/2002 | Dadafshar |
| 2002/0125941 | A1* | 9/2002 | Nguyen ............... 330/251 |
| 2002/0175747 | A1 | 11/2002 | Tang et al. |
| 2004/0028242 | A1 | 2/2004 | Kitamura |
| 2004/0174241 | A1 | 9/2004 | He et al. |
| 2005/0253565 | A1 | 11/2005 | Cohen |
| 2006/0097779 | A1 | 5/2006 | Balakrishnan et al. |
| 2007/0139151 | A1 | 6/2007 | Nussbaum |
| 2007/0159289 | A1 | 7/2007 | Lee et al. |
| 2008/0192960 | A1 | 8/2008 | Nussbaum et al. |
| 2009/0004126 | A1 | 1/2009 | Lowndes |
| 2009/0027025 | A1 | 1/2009 | Latham et al. |
| 2009/0041266 | A1 | 2/2009 | Guo et al. |
| 2009/0102295 | A1 | 4/2009 | Petersen |
| 2010/0219926 | A1 | 9/2010 | Willers et al. |

FOREIGN PATENT DOCUMENTS

| DE | 102007019110 A1 | 10/2008 |
| EP | 1764901 A2 | 3/2007 |
| GB | 2250383 A | 6/1992 |
| GB | 2351620 A | 1/2001 |

OTHER PUBLICATIONS

International Search Report and Written Opinion dated May 18, 2011 for Int. Appln. No. PCT/US2011/024675.
International Search Report and Written Opinion dated Aug. 3, 2011 for PCT/US2011/026015.
Texas Instruments, "2×210 Watt Stereo Digital Amplifier Power Stage," Oct. 2006—Revised Jul. 2007.
International Preliminary Report on Patentability dated Sep. 13, 2012 for PCT/US2011/024434.

(Continued)

*Primary Examiner* — Khanh V Nguyen

(57) ABSTRACT

An audio power amplifier with a four-quadrant power supply having a synchronous output rectifier that includes a planar transformer. The amplifier includes a first amplification unit including a switching voltage amplifier with a command signal input and an amplified signal output. Control electronics provide a signal input to the first amplification unit.

21 Claims, 11 Drawing Sheets

OTHER PUBLICATIONS

F. N. Poon et al: "Very fast transient voltage regulators based on load correction", 30th Annual IEEE Power Electronics Specialists Conference, vol. 1, pp. 66-71, Jun. 27, 1999.

International Preliminary Report on Patentability dated Sep. 13, 2012 for PCT/US2011/026015.

International Preliminary Report on Patentability dated Sep. 13, 2012 for PCT/US2011/024675.

International Search Report and Written Opinion dated Dec. 4, 2012 for International application No. PCT/US2012/054064.

Yongtao Han et al: "A Practical Copper Loss Measurement Method for the Planar Transformer in High-Frequency Switching Converters," IEEE Transactions on Industrial Electronics, IEEE Service Center, Piscataway, NJ, USA, vol. 54, No. 4, Aug. 1, 2007, pp. 2276-2287, XP011188771, ISSN: 0278-0046, DOI: 10.1109/TIE.2007.899877, figure 6.

* cited by examiner

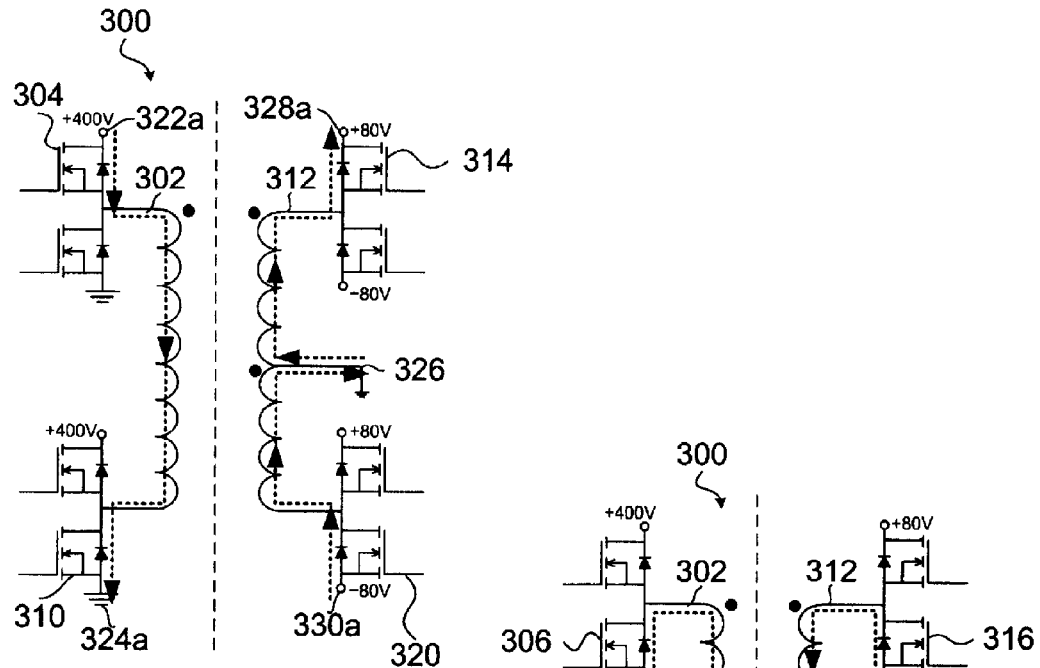
Fig. 8A
Fig. 8B
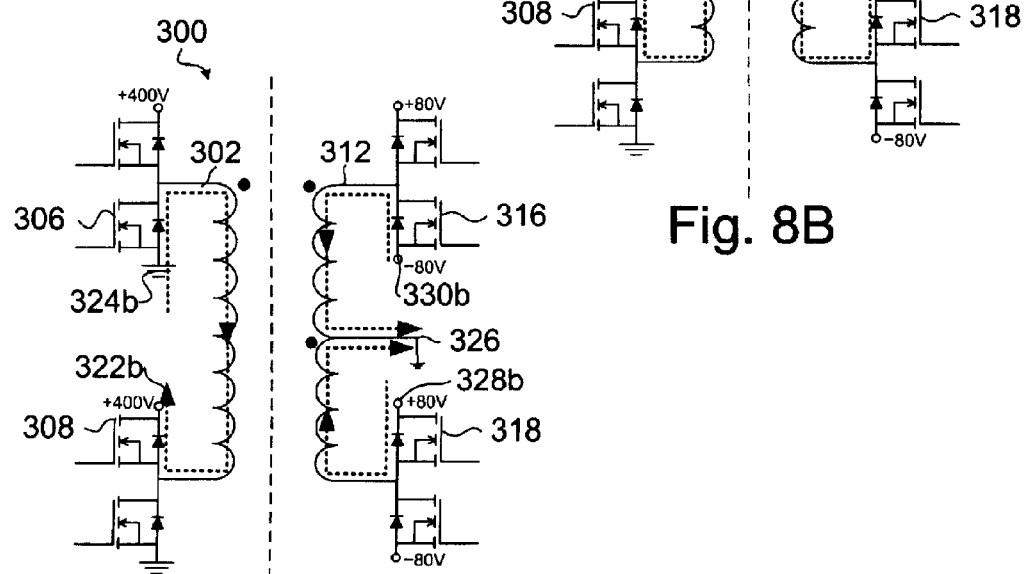
Fig. 8C

VERSATILE AUDIO POWER AMPLIFIER

This application is a continuation-in-part of U.S. patent application Ser. No. 13/160,806 (filed on Jun. 15, 2011) which is a continuation of U.S. patent application Ser. No. 12/717,198 filed on Mar. 4, 2010 and titled "Versatile Audio Power Amplifier (Now U.S. Pat. No. 7,986,187).

BACKGROUND

This disclosure relates to a versatile audio power amplifier.

Switching amplifiers, also called Class D amplifiers, amplify an input signal by modulating that signal into a series of pulses that drive a complementary pair of transistors operated in the switching mode. The transistors alternately couple positive and negative power sources to the output, which in total produce an amplified representation of the input signal.

SUMMARY

In general, in some aspects, an audio power amplifier has a four-quadrant power supply having a synchronous output rectifier that includes a planar transformer. The amplifier includes a first amplification unit including a switching voltage amplifier with a command signal input and an amplified signal output. Control electronics provide a signal input to the first amplification unit.

Implementations may include one or more of the following features. The audio power amplifier includes a second amplification unit including a switching voltage amplifier having a command signal input and an amplified signal output. Each amplification unit includes: an output filter between the amplified signal output and a load terminal, a current compensator with a current-compensated command signal output coupled to the command signal input of the switching voltage amplifier, an inner current feedback loop feeding a measurement of current measured at the output filter back to a summing input of the current compensator, a voltage compensator with a voltage-compensated command signal output coupled to the summing input of the current compensator, and an outer voltage feedback loop feeding voltage at the load terminal back to a summing input of the voltage compensator. A first controlled signal path may be included from the voltage-compensated signal output of the voltage compensator of the first amplification unit to the summing input of the current compensator of the second amplification unit. The second amplification unit may be configured to use the voltage-compensated command signal of the first amplification unit as input to the current compensator of the second amplification unit in place of the voltage-compensated command signal of the second amplification unit when the first controlled signal path is activated. The control electronics may provide a signal input to the second amplification unit and control the first controlled signal path such that the first and second amplification units are operable with separate loads, in parallel driving a common load, or across a bridge-tied-load.

Implementations may include one or more of the further following features. The first and second amplification units can be operable with separate loads by each amplifying separate signals and providing the amplified signals on their separate output terminals. The first and second amplification units can be operable in parallel driving a common load by each amplifying the same signal, provided from the first amplification unit to the second amplification unit via the first controlled signal path, and providing identical amplified signals on their separate output terminals, which are to be coupled to a common input terminal of the load. The first and second amplification units can be operable across a bridge-tied-load by amplifying a first signal in the first amplification unit and amplifying an inverted copy of the first signal in the second amplification unit, and providing their respective amplified signals on their separate output terminals, which are to be coupled to separate input terminals of the load.

Implementations may include one or more of the further following features. The amplifier may further include a third and a fourth amplification unit substantially identical to the first and second amplification units. A second controlled signal path can be provided from the voltage-compensated command signal output of the voltage compensator of the third amplification unit to the summing input of the current compensator of the fourth amplification unit. The control electronics further provide signal inputs to the third and fourth amplification units and control the second controlled signal path such that the third and fourth amplification units are operable with separate loads, in parallel driving a common load, or across a bridge-tied-load. All four of the amplification units can be operable together with the first and second amplification units in parallel driving a first side of a bridge-tied-load, and the third and fourth amplification units in parallel driving a second side of the bridge-tied-load.

Implementations may include one or more of the further following features. The four amplification units can operable together by (a) amplifying a first signal in each of the first and second amplification units, provided from the first amplification unit to the second amplification unit via the first controlled signal path, and providing identical amplified first signals on the separate output terminals of the first amplification unit and the second amplification unit, and (b) amplifying an inverted copy of the first signal in each of the third and fourth amplification units, provided from the third amplification unit to the fourth amplification unit via the second controlled signal path, and providing identical amplified inverted first signals on the separate output terminals of the third amplification unit and the fourth amplification unit. The output terminals of the first and second amplification units can be coupled to a first input of the load, and the output terminals of the third and fourth amplification units can be coupled to a second input of the load.

Implementations may include one or more of the further following features. The synchronous output rectifier can include a MOSFET. The first controlled signal path can include a switch controlled by the control electronics. The switching voltage amplifiers can each include a modulator, a gate driver, a pair of transistors, and a pair of diodes coupled between the source and drain terminals of the transistors. The transistors can include MOSFETS, the diodes being intrinsic to the MOSFETS. The output filter can include an output inductor and the measured current is the current through the output inductor.

Implementations may include one or more of the further following features. The amplifier may include a second, a third, and a fourth amplification unit each including a switching voltage amplifier having a command signal input and an amplified signal output. Each amplification unit may include an output filter between the amplified signal output and a load terminal, a current compensator with a current-compensated command signal output coupled to the command signal input of the switching voltage amplifier, an inner current feedback loop feeding a measurement of current measured at the output inductor back to a summing input of the current compensator, a voltage compensator with a voltage-compensated command signal output coupled to the summing input of the current compensator, and an outer voltage feedback loop feeding voltage at the load terminal back to a summing input of the voltage compensator. The first and second amplification units may have a first controlled signal path from the voltage-compensated command signal output of the voltage compensator of the first amplification unit to the summing input of the current compensator of the second amplification unit. The second amplification unit may be configured to use the voltage-compensated command signal of the first amplification unit as input to the current compensator of the second amplification unit in place of the voltage-compensated command signal of the second amplification unit when the first controlled signal path is activated. The third and fourth amplification units having a second controlled signal path from the voltage-compensated command signal output of the voltage compensator of the third amplification unit to the summing input of the current compensator of the fourth amplification unit. The fourth amplification unit can be configured to use the voltage-compensated command signal of the third amplification unit as input to the current compensator of the fourth amplification unit in place of the voltage-compensated command signal of the fourth amplification unit when the second controlled signal path is activated. The control electronics can provide signal inputs to each of the second, third and fourth amplification units and control the first and second controlled signal paths such that the first and second of the amplification units are operable with separate loads, in parallel driving a common load, or across a bridge-tied-load; the third and fourth of the amplification units are operable with separate loads, in parallel driving a common load, or across a bridge-tied-load; and all four of the amplification units are operable together with the first and second units in parallel driving a first side of a bridge-tied-load, and the third and fourth units in parallel driving a second side of the bridge-tied-load.

Implementations may include one or more of the further following features. The amplifier may further include a second amplification unit that includes a switching voltage amplifier having a command signal input and an amplified signal output. The control electronics can provide a signal input to the second amplification unit and control the first and second amplification units such that the first and second amplification units are operable in each of three modes. The three modes include (i) a first mode in which the first amplification unit amplifies a first signal and drives a first load, and the second amplification unit amplifies a second signal and drives a second load; (ii) a second mode in which the first amplification unit amplifies a first signal, the second amplification unit amplifies the first signal, and the amplified signal outputs of the first and second amplification units drive a single terminal of a first common load in parallel; and (iii) a third mode in which the first amplification unit amplifies a first signal, the second amplification unit amplifies an inverse of the first signal, and the amplified signal outputs of the first and second amplification units drive opposite terminals of a common load in a bridge-tied-load configuration.

Implementations may include one or more of the further following features. The amplifier can further include a third and a fourth amplification unit substantially identical to the first and second amplification units. The control electronics can further provide signal inputs to the third and fourth amplification units and control the third and fourth amplification units such that the third and fourth amplification units are operable (a) with separate respective third and fourth loads, (b) in parallel driving a single terminal of a second common load in parallel, or (c) to drive the opposite terminals of the common load in the bridge-tied-load configuration.

According to another aspect, a method of amplifying audio-frequency signals includes providing a four-quadrant power supply having a synchronous output rectifier that includes a planar transformer. A first amplification unit is provided that includes a switching voltage amplifier having a command signal input and an amplified signal output. Control electronics are provided that provide a signal input to the first amplification unit.

Implementations may include one or more of the following features. A second amplification unit is provided. In each of a first and a second amplification units, a current-compensated command signal in a switching voltage amplifier is amplified, and an amplified signal output is provided. Current through an output filter is measured between the amplified signal output of the switching voltage amplifier and a load terminal, and a current measurement is produced. The current measurement is fed back to a summing input of a current compensator via an inner current feedback loop. At the current compensator, (i) the current measurement is compared to a voltage-compensated command signal, (ii) the current-compensated command signal is provided to the switching voltage amplifier, (iii) at a load terminal of the first/second_amplification unit voltage is fed back to a summing input of a voltage compensator via an outer voltage feedback loop, (iv) at the voltage compensator, the feedback voltage is compared to an input command signal, and (v) the voltage-compensated command signal is provided to the summing input of the current compensator. A first controlled signal path is controlled from an output of the voltage compensator of the first amplification unit to the summing input of the current compensator of the second amplification unit, to selectively provide the voltage-compensated command signal of the first amplification unit to the summing input of the second amplification unit in place of the voltage-compensated command signal of the second amplification unit. Signal inputs are provided to the first and second amplification units and the first controlled signal path is controlled to selectively operate the first and second amplification units with separate loads, in parallel driving a common load, or across a bridge-tied-load.

Advantages include comprehensive configurability with high efficiency. The amplifier can serve a wide variety of connection topologies, load impedances, and power levels without hardware modification. Being able to drive loudspeakers at a wide range of impedances from a single amplifier allows the amplifier to support a diverse range of audio system configurations without requiring a diverse set of amplifier products.

Other features and advantages will be apparent from the description and the claims.

BRIEF DESCRIPTION OF THE DRAWINGS

FIGS. 8A through 8C show power flow through the isolation converter of FIG. 7.

DESCRIPTION

Figure 1A:
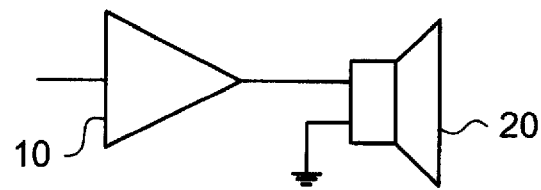
FIGS. 1A through 1D show block diagrams of amplifier-speaker topologies.
Figure 1B:
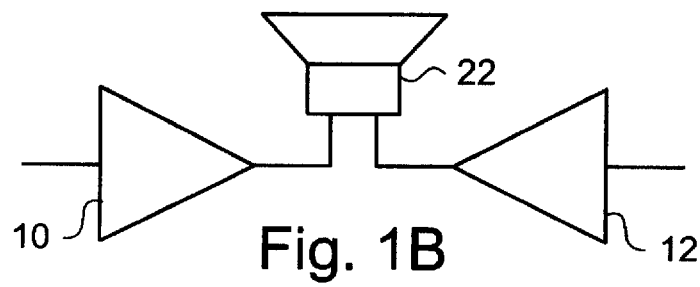

Power amplifiers may be connected to their loads in a number of topologies, depending on the nature and intended use of the loads. FIGS. 1A through 1D show four topologies for connecting power amplifiers to loudspeakers. In FIG. 1A, a single amplifier 10 drives a loudspeaker 20 by providing power to one terminal of the loudspeaker, while the other terminal is grounded. This is a typical configuration sometimes referred to as a "half-bridge." In FIG. 1B, a "full-bridge" configuration is shown, where two amplifiers 10 and 12 are used, one connected to each terminal of the loudspeaker 22. The second amplifier 12 is driven with an inverse of the signal to the first amplifier 10, so the total voltage across the loudspeaker 22 is doubled, while the current remains the same as that in the half-bridge configuration. By providing twice the voltage at the same current, this configuration can drive loudspeakers with larger impedances than can be driven by the half-bridge. It can provide more power total, or the same power with less dissipation per amplifier. This mode of operation is ubiquitous in the audio amplifier field, and is often referred to as 'BTL' (bridge tied load) configuration.

Figure 1C:
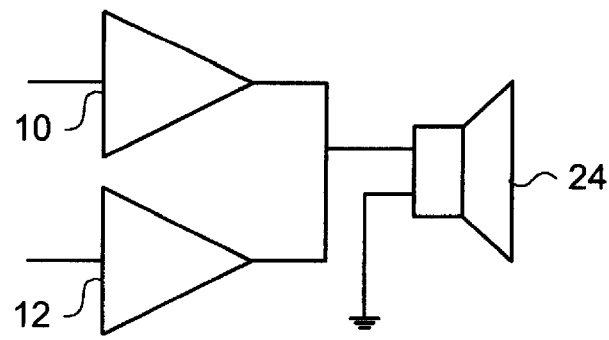

In FIG. 1C, the two amplifiers 10 and 12 are connected in parallel to a common terminal on the loudspeaker 24, while the other terminal is grounded. This is referred to as a "parallel" configuration. The parallel configuration delivers twice the current at the same voltage as the half-bridge configuration, which is useful for driving smaller impedances at the same power level as the BTL configuration. For example, if the half-bridge is optimized to provide 500 W to a 4Ω load, the current required to provide the same power into a 2Ω load or the voltage required to provide the same power to an 8Ω load may be at or beyond the limits of the amplifier. The parallel configuration can drive 500 W into a 2Ω load with half the dissipation of the single half-bridge, or drive a full 1 kW if each half-bridge can handle the current. The BTL configuration, on the other hand, can drive 500 W into an 8Ω load without approaching its voltage limits, or drive a full 1 kW if the voltages are available.

Figure 1D:
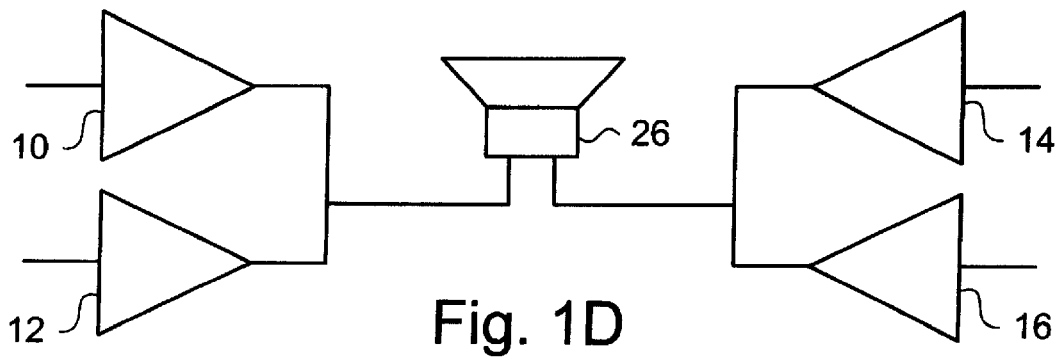

Finally, in FIG. 1D, four amplifiers 10, 12, 14, and 16 are used, with a parallel pair of amplifiers connected to each terminal of the loudspeaker 26. One pair, 10 and 12, is driven with the opposite signal of the other pair, 14 and 16. This is referred to as a parallel-bridged configuration, and delivers twice the voltage and twice the current as a single half-bridge, for four times the power. Using the same example as above, if each half-bridge is optimized for 500 W at 4Ω, the parallel-bridged configuration can deliver 2 kW to a 4Ω load, with the same voltage and current per amplifier stage.

With a class D amplifier, management of current-sharing between two parallel amplifiers is more important than in linear, or class AB, amplifiers, because the dissipated power in a switching device is proportional to $I^2$, rather than to I, as it is in a linear amplifier. Sharing current between two identical devices will decrease conduction loss by roughly a factor of two in the switching amplifier. The decrease will actually be a bit more than a factor of two because there are further gains due to the temperature coefficient of resistance of the FET—decreasing the current also decreases the temperature, which in turn decreases the intrinsic resistance of the device. If the current is not controlled, however, it is likely that one of the two devices will deliver substantially more current than the other, losing the benefits of parallel operation and possibly damaging the amplifiers.

Figure 2:
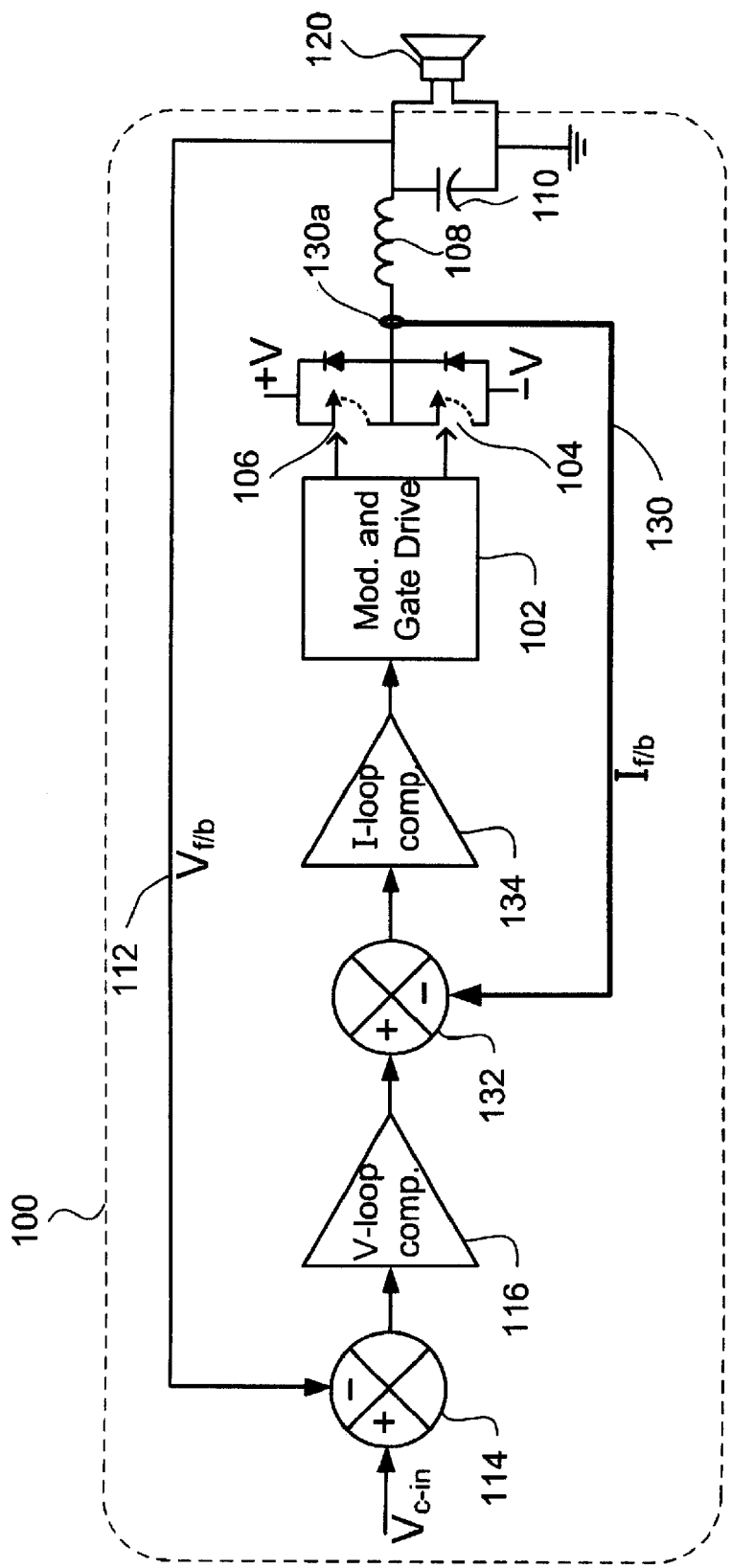
FIG. 2 shows a circuit diagram of a single amplifier stage.

To provide efficient current sharing in topologies, a feedback loop may be added to the amplifier. For example, as shown in FIG. 2, a unit cell 100 provides one half-bridge class D audio amplifier, shown connected to an arbitrary loudspeaker 120. The core of the amplifier includes a modulator and gate driver 102, a switching power-output stage made up of transistors 104 and 106, and an output filter including an inductor 108 and capacitor 110. The control system includes an outer voltage loop 112 that feeds back the output voltage at the load 120 to a summer 114 and voltage-loop compensator 116. The summer 114 also receives the input voltage command $V_{c-in}$. The modulator and gate driver 102, in combination with the transistors 104 and 106, constitute a voltage amplifier.

To allow current sharing when two of these unit cells 100 are connected in parallel, an inner current loop 130 is provided. The inner current loop 130 feeds back a measurement of output current, from a current sense 130a, to another summer 132 and current-loop compensator 134. The inner current loop controls the output current of the amplifier, so that two amplifiers operating in parallel will each provide half the total current; neither will attempt to deliver all the current and lose the advantages of parallel operation. In this configuration, the current loop around the core voltage amplifier turns the system into a current amplifier, and the outer voltage loop turns the entire unit cell 100 back into a voltage amplifier.

The inner current loop provides some additional advantages. The current loop naturally provides current limiting within the unit cell. That is, the feedback 130 to the current-loop compensator 134 prevents the command into the modulator 102 from causing a current gain in excess of the maximum current command from the voltage-loop compensator 116, even if the load is shorted. Additionally, because the inner current loop provides control, the voltage measurement used for the outer voltage loop can be moved outside the output filter, closer to the load (as shown). (An output filter typically imposes a 180° phase shift, around which a control loop could not be closed.) Moving the voltage loop to after the output filter allows the amplifier to support a greater variety of loads while the inner current loop maintains stability. The inner current loop 130 can also be used to provide pulse width error correction in the modulator 102, as described in U.S. patent application Ser. No. 12/717,224, titled "Reducing Pulse Error Distortion," and filed the same day as this application, the entire contents of which are incorporated here by reference.

The summers 114 and 132 are not necessarily discrete components, but may be, for example, summing inputs of the compensators 116 and 134. The compensators preferably are built from standard circuit components, i.e., op-amps and associated circuitry. The current-sensing element 130a may be any standard current-sensing technology, such as discrete Hall-effect sensors. The output inductor 108 may be formed using planar windings on a printed circuit board, and part of the current sense is provided by a current sense winding integrated into the output inductor 108, as described in U.S. patent application Ser. No. 12/717,208, titled "Planar Amplifier Output Inductor with Current Sense," and filed the same day as this application, the entire contents of which are incorporated here by reference. As explained in that patent application, forming the current-sense winding as part of the PCB windings of the output inductor advantageously shields the current-sense signal from noise within the inductor. The inductor's current-sensing winding indicates an AC component of the current, while a Hall-effect sensor may also be used to indicate the DC component of the current.

In some examples, these unit cells are combined in groups of 4. Each group has appropriate interconnections within the control system, allowing a single set of four unit cells to provide any of the topologies shown in FIGS. 1A through 1D. The user, through control software, for example, may specify the particular topology needed. To detect connection problems and confirm that the topology of connected loudspeakers matches the configuration of the amplifier components, an amplifier product may include circuitry for detecting the type and topology of the connected loudspeakers. One such system is described in U.S. patent application Ser. No. 12/114,265, titled "Detecting a Loudspeaker Configuration," filed May 2, 2008, the entire contents of which are incorporated here by reference. Such a system may also be used to discover the topology of the connected loudspeakers and automatically configure the amplifier accordingly.

For independent half-bridge operation of multiple channels, each unit cell is connected to one loudspeaker as shown in FIG. 2, and separate signals are provided to each unit cell.

Figure 3:
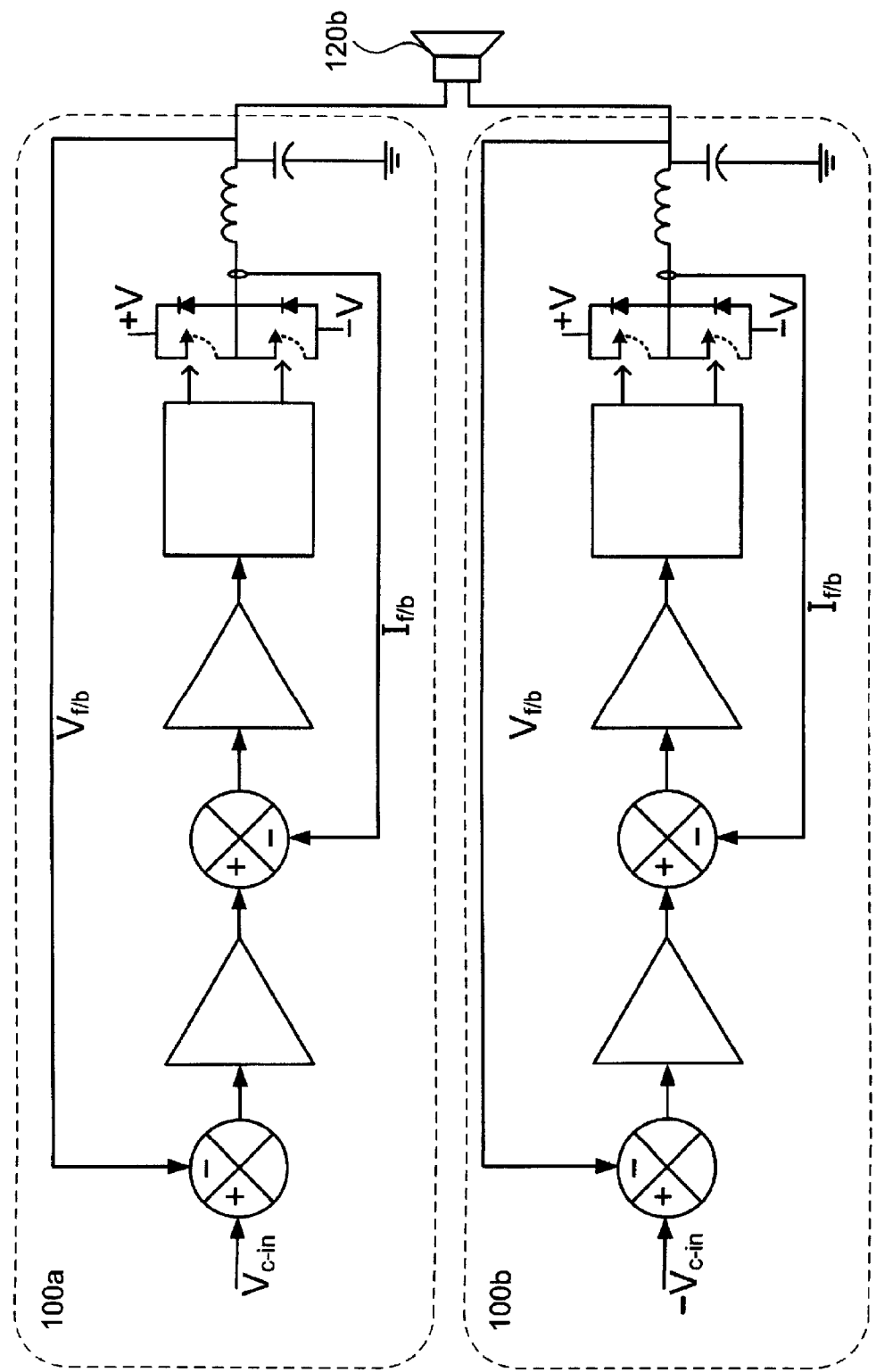
FIG. 3 shows a circuit diagram of two amplifier stages in a bridged configuration.

As shown in FIG. 3, two half bridges 100a and 100b may be combined into a full bridge configured to drive a single loudspeaker 120b as a bridge-tied-load to provide double the voltage of a single unit cell. In this configuration, the amplifiers in the unit cells are substantially independent, and are simply given input commands $V_{c-in}$ 180° out of phase, i.e., $+V_{c-in}$, and $-V_{c-in}$. No modification to the control of either unit cell is needed for BTL operation, though a product intending to support this mode may handle inverting the $V_{c-in}$ input, rather than relying on the user to provide both the original and inverted signal. Inverting of the signal may be done in the control electronics (not shown), or by an additional inverting amplifier (not shown), either under the control of control electronics or directly controlled by a physical switch available to the user.

Figure 4:
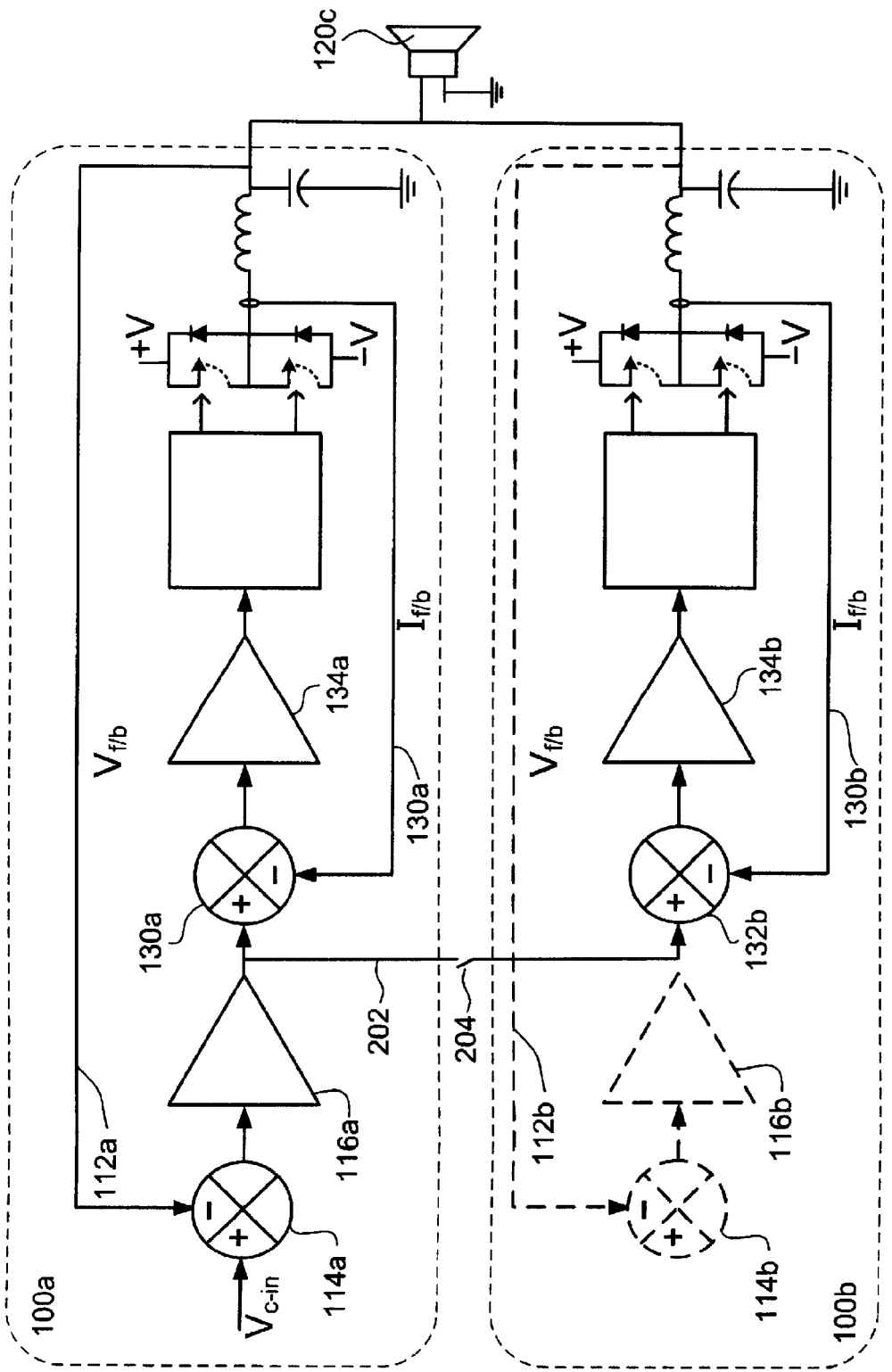
FIG. 4 shows a circuit diagram of two amplifier stages in a parallel configuration.

As shown in FIG. 4, two half bridges 100a and 100b may be combined as a parallel pair to provide the same voltage and twice the current of a single unit cell. In this configuration, one outer voltage loop 112a is configured to feed commands, through the first unit's outer voltage loop summer 114a and compensator 116a, to the inner current loops and amplifying stages of both unit cells through a cross-cell connection 202 controlled by a switch 204. In this configuration the second outer voltage loop 112b and its summer 114b and compensator 116b are not used—they may be entirely deactivated, or the signal path from the compensator 116b to the summer 132b may be interrupted. Both half-bridge outputs are coupled to a common input of the loudspeaker 120c, with the other input grounded. The current loops 130a and 130b, summers 132a and 132b, and compensators 134a and 134b control current sharing between the half bridges by stabilizing each at the target current, as discussed above. The switch 204 may be controlled in various ways, including, for example, by control electronics, by passive circuitry, or by a physical switch available to the user.

Figure 5:
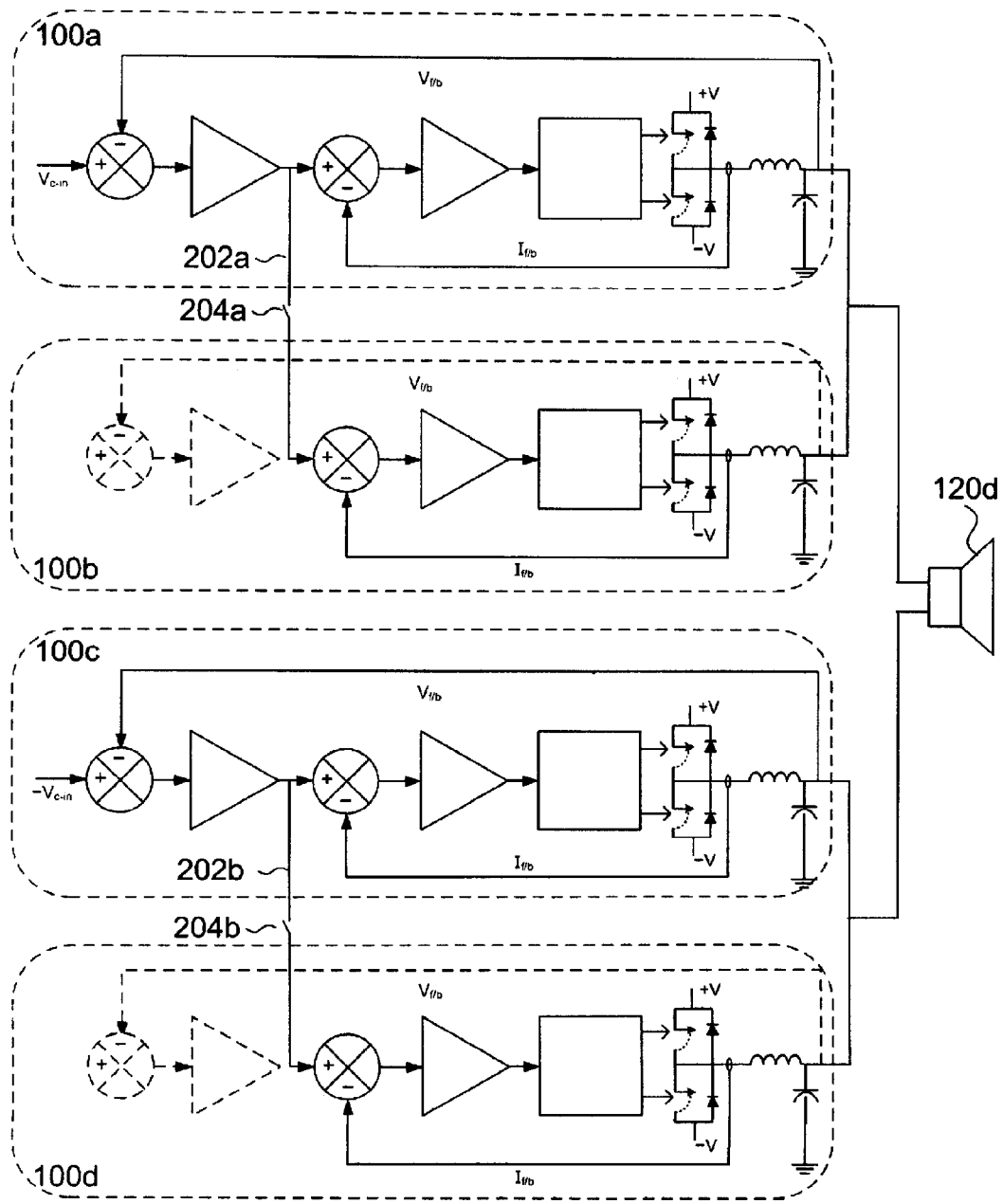
FIG. 5 shows a circuit diagram of four amplifier stages in a parallel-bridged configuration.

As shown in FIG. 5, four half-bridges 100a, 100b, 100c, and 100d may be used together to provide a bridged-parallel configuration delivering double the voltage and double the current of a single unit cell to a single loudspeaker 120d. Half-bridges 100a and 100b are configured as a first parallel pair with a cross-cell connection 202a and switch 204a, and coupled to a first input of the loudspeaker 120d. Half-bridges 100c and 100d are configured as a second parallel pair with a cross-cell connection 202b and switch 204b, and coupled to the second loudspeaker input. The second pair 100c/100d are given an inverted input signal $-V_{c-in}$ as in the BTL configuration of FIG. 3.

In some embodiments, the control circuitry of each of the half-bridge unit cells is independent, such that when two cells are used in the BTL or parallel configuration, the other two may be used as independent half-bridges, in the same two-cell configuration as the first two cells, or in the other two-cell configuration. In some examples, pairs or all four of the amplifier stages (modulator and gate drive) are provided in a single integrated circuit package, such as the TDA8932 from NXP Semiconductors, in Eindhoven, The Netherlands, or the TAS5103 from Texas Instruments in Dallas, Tex., while the transistors, control loops, and output filters are added to complete the amplifiers and enable the configurability described above. In some examples, the control loops and cross-cell connections are included in the amplifier IC.

Figure 6:
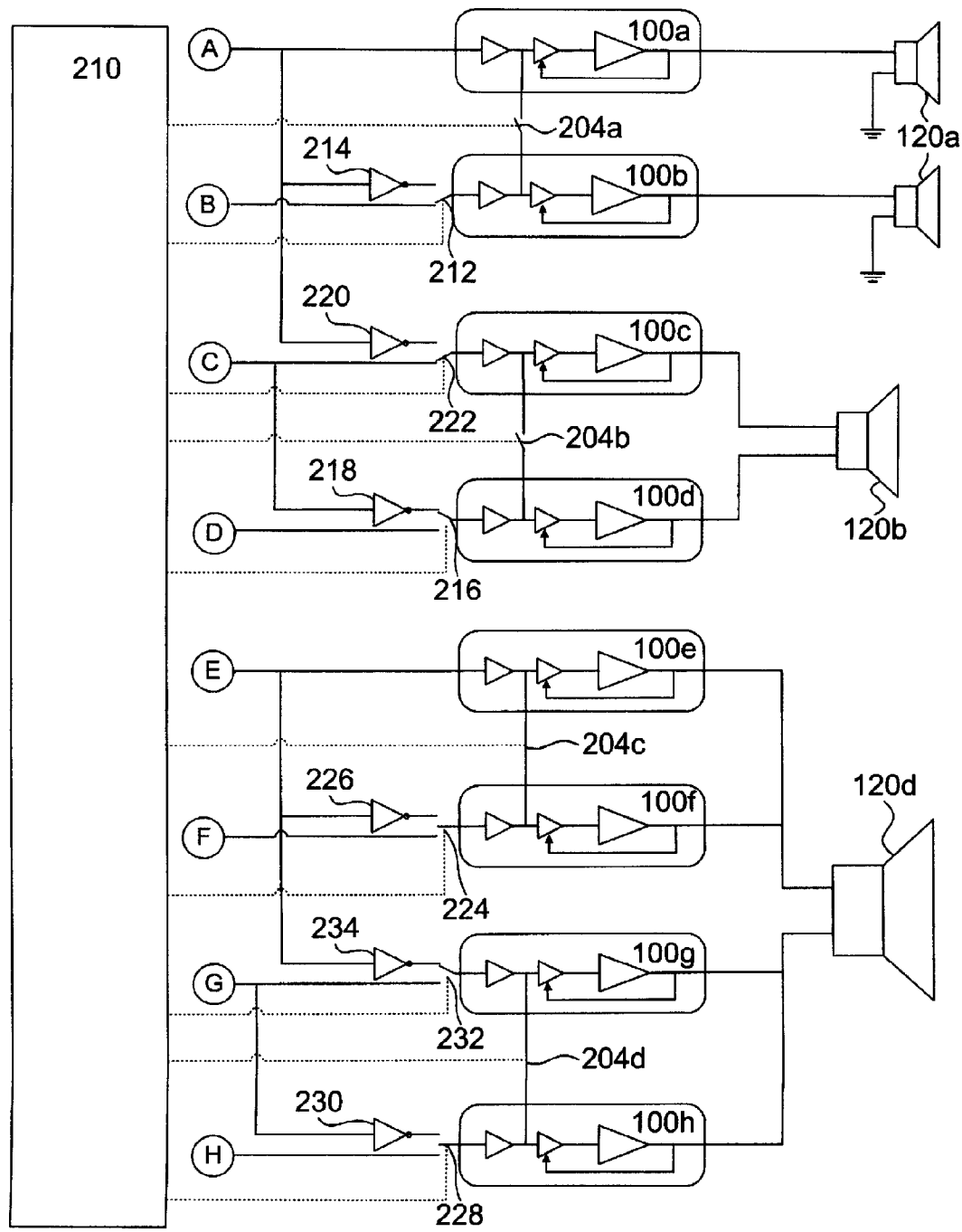
FIG. 6 shows a circuit diagram of a configurable amplifier system.

As shown in FIG. 6, groups of unit cells can be combined, up to the limits of the power supply, to form highly configurable systems. In FIG. 6, a control module 210 is shown coupled to a number of switches identified below. Dotted lines show control signal paths while solid lines show audio signal paths. Two sets of four half-bridge unit cells are shown, numbered 100a through 100h. The connections in the second set 100e-100h are identical to those in the first set 100a-100d, though they are shown with the switches in different positions. Eight inputs A through H are available, but not all are used. The switch positions in FIG. 6 are set to show the first two unit cells 100a and 100b each providing their respective inputs A and B to separate loudspeakers 120a, unit cells 100c and 100d providing input C to a single loudspeaker 120b in a BTL configuration, and unit cells 100e, 100f, 100g, and 100h together providing input E to a loudspeaker 120d in a parallel-bridged configuration, with each pair 100e/100f and 100g/100h powering one input of the loudspeaker in parallel.

For the two unit cells 100a and 100b being operated as independent half-bridges, a first switch 204a controls the signal path between the two unit cells 100a and 100b, for providing common current control when operating in parallel, as discussed above. In the example of FIG. 6, switch 204a is open, because unit cells 100a and 100b are acting separately. Another switch 212 controls which signal is input to the unit cell 100b. For half-bridge operation, as shown, switch 212 couples the signal input "B" to the unit cell 100b.

For BTL operation, an inverter 214 is available to couple an inverted copy of input signal "A" to the unit cell 100b, where the switch 212 would provide that signal rather than the input "B" used for half-bridge operation. This is the case in the second pair of unit cells 100c and 100d, where the switch 204b is open, and a switch 216 is coupling an inverter 218 to the input of unit cell 100d, providing an inverted copy of input "C". Another inverter 220 and input switch 222 control the input to unit cell 100c, for use in parallel-bridged configurations, discussed below with reference to the second set of four unit cells. In FIG. 6, the input switch 222 is coupling the input "C" to the unit cell 100c.

Unit cells 100e and 100f are shown configured for parallel operation. In this mode, the input switch 224 on unit cell 100f does not provide any signal input to the second unit cell, as the closed switch 204c provides the current command signal from inside the unit cell 100e to the current feedback loop comparator in unit cell 100f, skipping the voltage command input and voltage feedback loop comparator of unit cell 100f. In some configurations, the input of unit cell 100f is disconnected internally when used in parallel operation, so the input switch 224 may remain coupled to one of its inputs. The inverter 226 is available to provide an inverted version of input "E" for use in BTL mode. Unit cells 100*g* and 100*h* are also shown configured for parallel operation, and in particular, they are configured for use in a parallel-bridged mode with unit cells 100*e* and 100*f*. Switch 204*d* provides the current command signal to unit cell 100*h* from inside unit cell 100*g*, while switch 228 is open and inverter 230 is unused. At unit cell 100*g*, a switch 232 couples an inverted copy of input "E" from an inverter 234 to the input of unit cell 100*g*, so that the two sets of parallel half-bridges 100*e*/100*f* and 100*g*/100*h* receive E and −E, respectively, as inputs.

Although the switches, inverters, and signal sources are shown external to the control module 210, some or all of the switches and inverters may be integrated into the control module, and may be configured in hardware, firmware, or software, depending on the technology used. If the switches and inverters are integrated to the control module, the inputs A through H would also pass through the control module. The control module may be any suitable device, such as a programmed microprocessor, an application-specific integrated circuit, or a collection of discrete devices. The control module may also apply digital signal processing to the inputs A through H, in addition to the switching and inverting used to configure the amplifier topology. There may be a separate control module for each set of four unit cells. In some cases, the control module may be configured to use all eight unit cells in a cascading pattern of bridged and parallel groupings to deliver the entire capacity of the power supply to one loudspeaker (additional connections between amplifiers and/or signal paths would be needed, though these may all be provided by a suitable control module).

Such a configuration is capable of driving numerous configurations of loudspeakers. For example, an 4000 W amplifier system containing two groups of four unit cells, at 500 W each, can drive many different combinations of speakers, as shown in table 1 (with the actual wattage depending on the impedance of the particular loudspeakers used).

| Unit 1 | Unit 2 | Unit 3 | Unit 4 | Unit 5 | Unit 6 | Unit 7 | Unit 8 |
|---|---|---|---|---|---|---|---|
| 500 W | 500 W | 500 W | 500 W | 500 W | 500 W | 500 W | 500 W |
| 1000 W Parallel or BTL | | 1000 W Parallel or BTL | | 500 W | 500 W | 500 W | 500 W |
| 1000 W Parallel or BTL | | 1000 W Parallel or BTL | | 1000 W Parallel or BTL | | 500 W | 500 W |
| | | 2000 W Parallel-Bridged | | | | 1000 W Parallel or BTL | | 500 W | 500 W |
| | | 2000 W Parallel-Bridged | | | | 1000 W Parallel or BTL | | 1000 W Parallel or BTL | |
| | | 2000 W Parallel-Bridged | | | | 2000 W Parallel-Bridged | | | |

Figure 7:
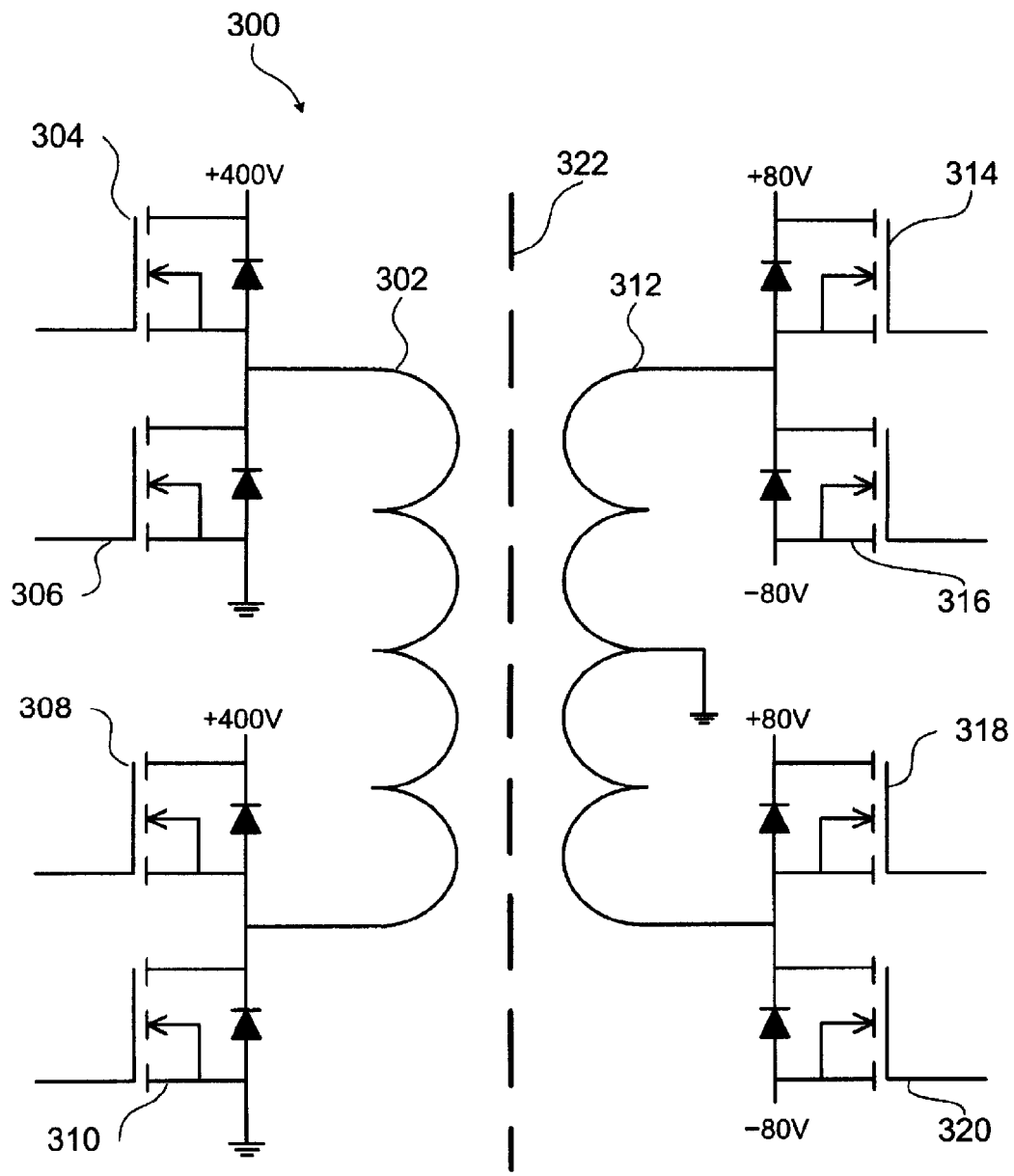
FIG. 7 shows a circuit diagram of an isolation converter.

One or more of these groups of four unit cells are combined with an appropriate power supply, such as that described in co-pending U.S. patent application Ser. No. 12/717,216, titled "Power Supply Transient Response Improving," and filed the same day as this application, the entire contents of which are incorporated here by reference. In some examples, an advantageous feature provided within the power supply is a synchronous output rectifier, which solves the 'bus pumping' problem generally associated with class D half-bridges, and supports efficient operation of the highly-configurable amplifier stages described above (the bus-pumping problem is explained for reference below). A schematic representation of this synchronous output rectifier 300 is shown in FIG. 7. A primary winding 302 is coupled to switches 304, 306, 308, and 310, and a secondary winding 312 is coupled to switches 314, 316, 318, and 320. The windings are separated by an isolation barrier 322 and convert the +400 V supply voltage to the lower voltage used by the amplifiers, +/−80 V in this example. Such a rectifier powers the amplifier stages described above with the +80 V and −80 V ports coupled to the +V and −V rails of the amplifiers.

At the voltage levels typically used in an audio power amplifier, e.g., +/−80V or higher on the secondary windings, the secondary side switches 314-320 in this topology would typically be simple rectifiers. Instead, MOSFETs are used with their intrinsic diodes to provide a synchronous rectifier. This allows power to flow in either direction at any of the three ports of this power converter (+400 V primary, +80 V secondary, −80 V secondary), providing for full four-quadrant operation, as explained in FIGS. 8A through 8C.

FIG. 8A shows one half-cycle of normal operation, in which power is transferred from the primary winding 302 to the secondary winding 312. In this cycle, transistors 304 and 310 are on, so that current (shown by dotted arrows) flows from the +400 V rail 322*a* to the primary-side ground 324*a* by going through the primary winding 302 in a first direction, illustrated as downward. This induces current to flow in the opposite direction, illustrated as upward, in the secondary winding 312, due to the direction of the windings. That current flows from the −80 V rail 330*a* to the secondary-side ground 326 and from the secondary-side ground 326 to the +80 V rail 328*a* through the transistors 314 and 320. As noted above, the use of MOSFETs provides intrinsic diodes across the source and drain of the transistors.

FIG. 8B shows the other normal half-cycle, in which the transistors 306 and 308 are on, so that current flows from the +400 V rail 322*b* to the primary-side ground 324*b* by going through the primary winding 302 in the opposite direction, i.e., upward in the figure. The induced current in the secondary winding 312 then goes downward, and through the other set of secondary-side transistors 316 and 318, to again flow from the −80 V rail 330*b* to ground 326 and from ground 326 to the +80 V rail 328*b*, producing the same net power flow as in FIG. 8A.

FIG. 8C shows a different case, in which energy is being sourced from the +80 V rail, and flows into both the −80 V and +400 V rails. Note that the only difference between this and the case in FIG. 8B is the direction of current from the +80 V and +400 V rails. At transistors 306, 308, and 316, current is flowing in the direction of the intrinsic diodes. At the +80 V 328*b* rail, however, current is flowing against the direction of transistor 318, so that transistor must be switched on. In a standard power converter with a simple rectifier between the +80 V rails and the transformer secondary, energy could not flow in this direction. The use of MOSFETs in the secondary allows current flow in this direction. We have not drawn all possible cases, but it can be seen that the use of synchronous rectifiers on the secondary side allows energy to flow between any port and any other port of this system, allowing four-quadrant operation.

At lower output voltages, when the voltage drop across the rectifiers becomes a significant source of inefficiency, synchronous rectifiers are in common use today. However, they are not commonly used at the high voltages of audio power amplifiers, as the efficiency increase is very marginal, and there are significant technical hurdles to overcome to make the MOSFETs robust with reverse current flow and parasitic diode recovery. Using the technique in the system described above allows energy flow from reactive loads back into the system to be evenly distributed between all of the storage capacitance in the system, and it also solves the bus pumping problem associated with half-bridge class D stages.

Figure 9A:
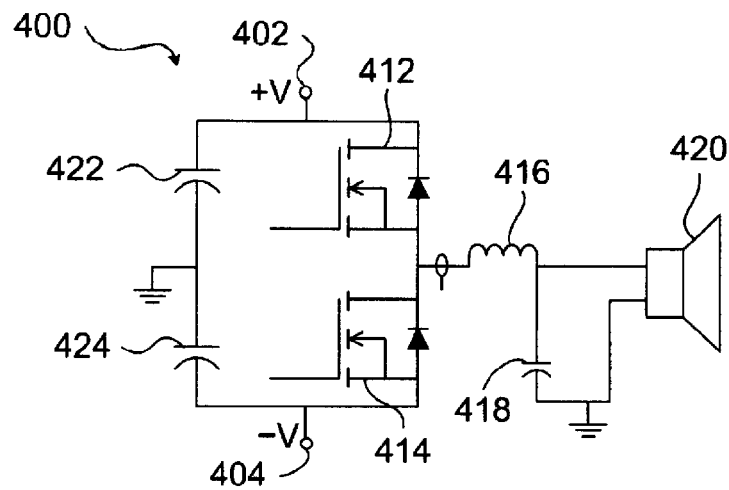
FIG. 9A shows a circuit diagram of a representative class D amplifier.

Bus pumping, also known as off-side charging or rail pumping, is explained with reference to FIGS. 9A-9C. As shown in FIG. 9A, a half-bridge class D amplifier 400 operates by switching the output inductor 416 between two voltage rails 402 and 404, labeled here is generic +V and −V. The modulator and gate drive are not shown, and the filter capacitors 422 and 424 are the only part of the power supply shown. The switching of transistors 412 and 414 occurs at a rate significantly higher than the signals being reproduced, so that at any given time we can treat the current in the output inductor 416 as relatively constant. Thus, for the state when current is flowing out of the inductor 416 and into the load 420, there are two switching states.

Figure 9B:
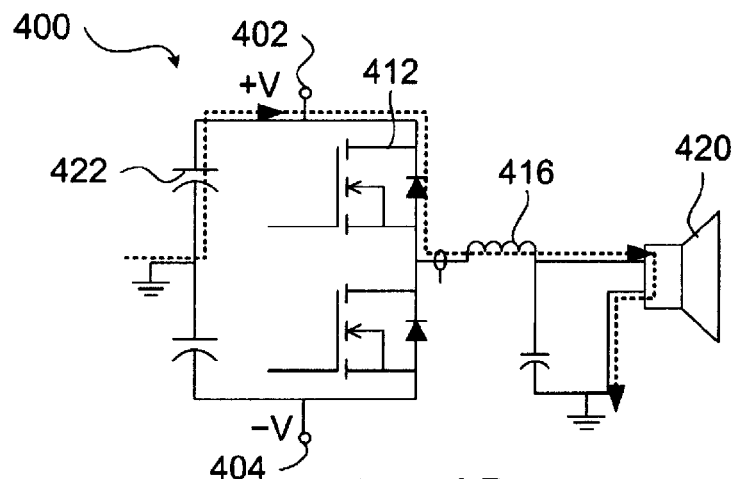
FIGS. 9B and 9C show energy flow through the amplifier of FIG. 9A.

In the first state, as shown in FIG. 9B, the top transistor 412 is on, and current (shown by the dotted arrow) flows from the +V rail 402. In this case, energy is flowing from the power supply to the output filter and the load.

Figure 9C:
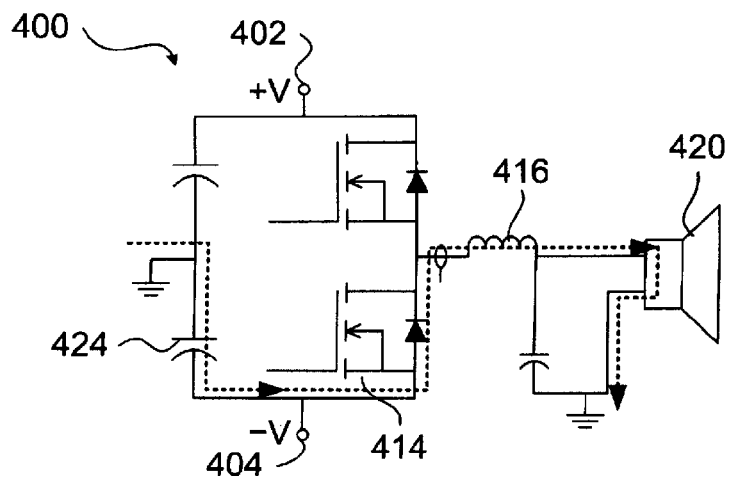

In the second state, as shown in FIG. 9C, the bottom transistor 414 is on, and current flows from the −V rail 404. In this case, energy is actually flowing back from the output filter and the load, and into the power supply. If the power supply filter capacitances 422 and 424 are large enough, they can absorb this energy for the duration of the event, but this would require unusually large capacitances.

The expression for average current regenerated into the rail over a half sine wave is as follows:

$$\frac{\sqrt{2p}\left(\sqrt{2p}\,\pi\sqrt{r} + (-8+\pi)v\right)}{4\pi\sqrt{r}\,v}$$

where 'p' is average power out, 'v' is rail voltage, and 'r' is load resistance. For example, a 20 Hz sine wave into a 4Ω load, of sufficient amplitude to give 500 W average power output, in an amplifier with ±80 V rails, will regenerate an average of 3 A over a half cycle. With 10 000 μF of capacitance on that rail, the system will experience a bus pumping of 7.5 V, which is almost 10% of the nominal. By using synchronous rectification, lower capacitances can be used and the system will still experience significantly less perturbation. In one example, with the above-mentioned voltages, a system with only 3500 μF capacitance per channel per rail experienced significantly less pumping of the bus than that just described.

Figure 10:
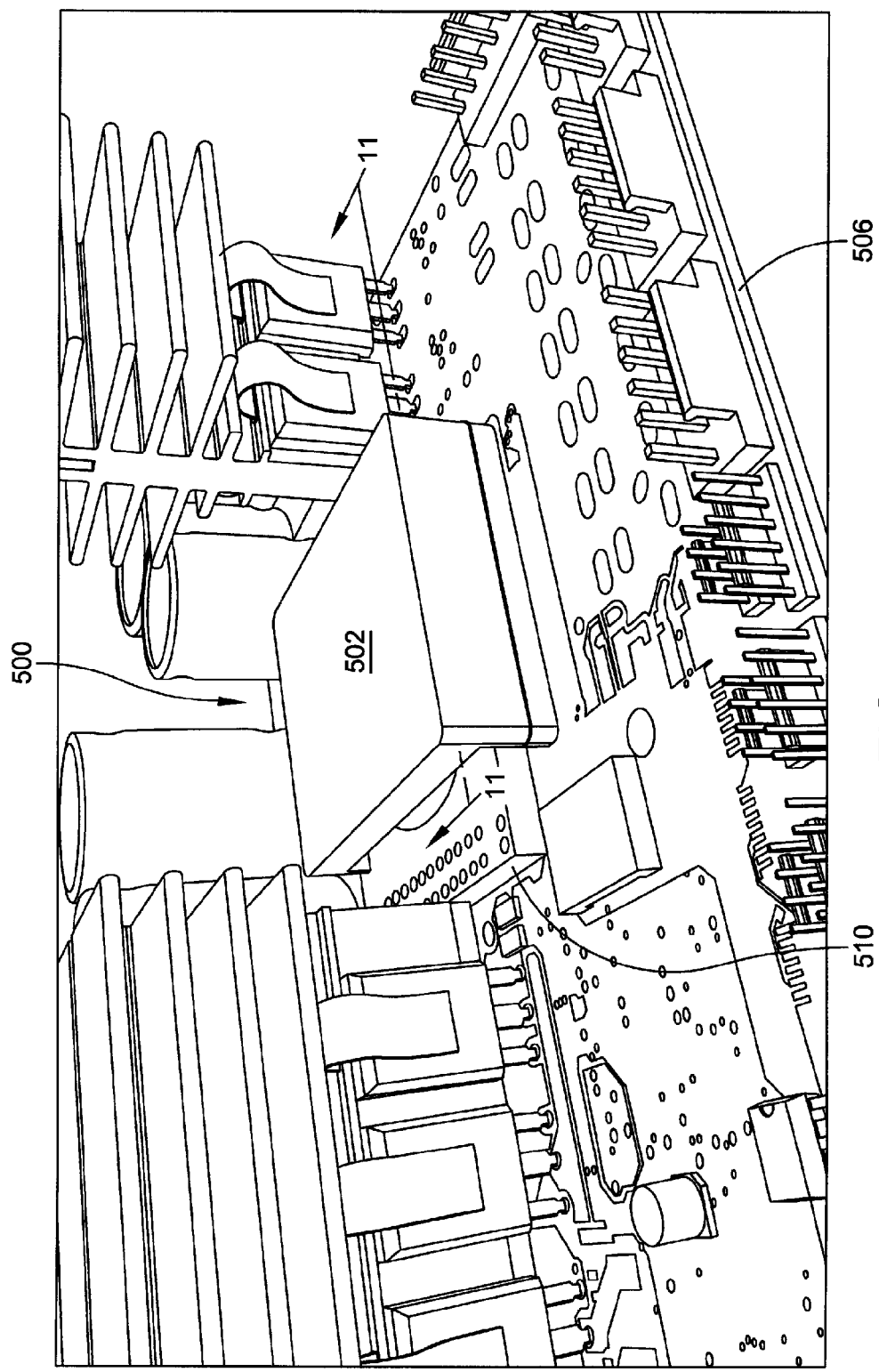
FIG. 10 shows a planar transformer mounted to a circuit board.
Figure 11:
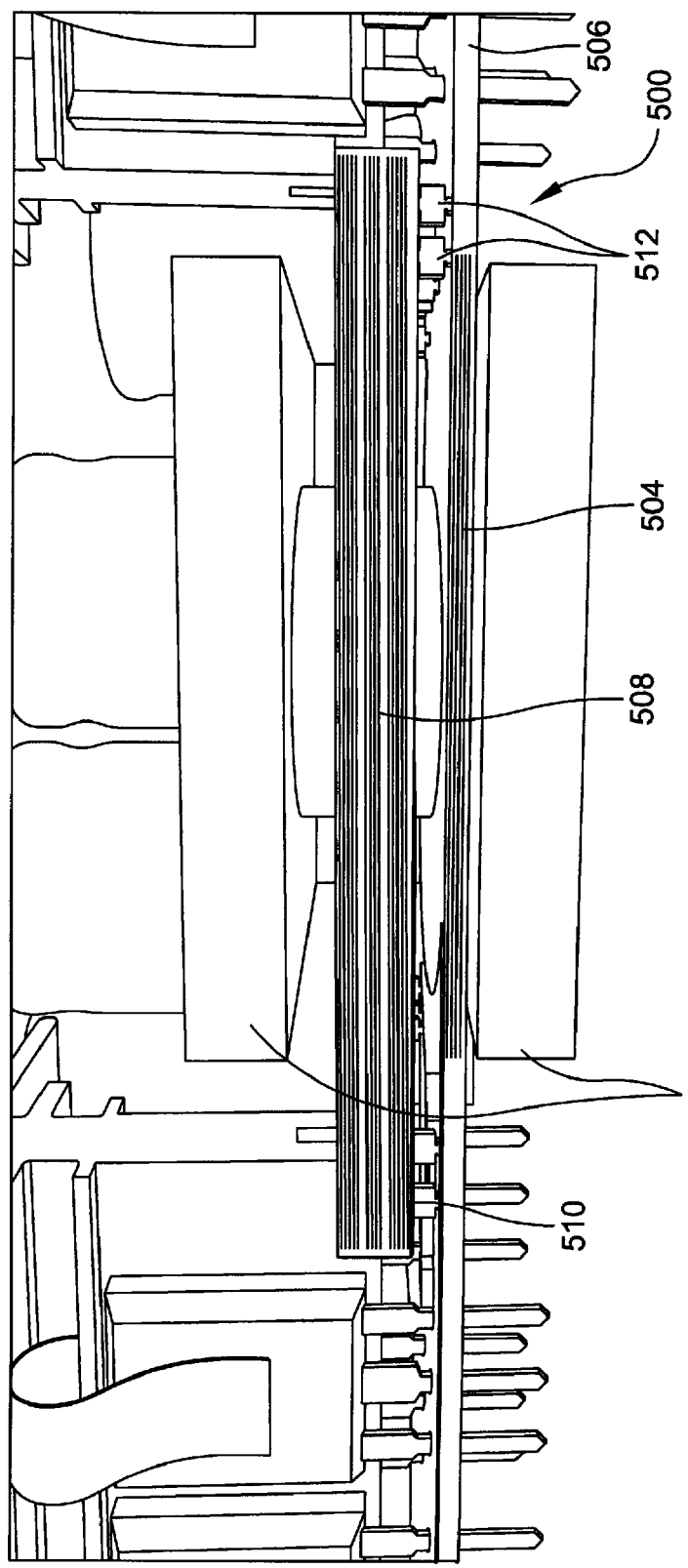
FIG. 11 is a sectional view of FIG. 10 taken along lines 11-11.

FIGS. 10 and 11 disclose a planar transformer which can be used as the transformer shown in FIGS. 7 and 8A-C. A planar transformer is a transformer having planar primary and/or secondary windings that are located on and/or in one or more printed circuit boards (PCBs). The planar transformer includes ferrite cores 502. Secondary windings 504 of the planar transformer are located in a main PCB 506. Primary windings along with further secondary windings together labeled 508 are located in an auxiliary PCB 510. A number of conductive pins 512 electrically connect the main PCB 506 and the auxiliary PCB 510. A planar transformer provides well controlled and predictable leakage inductance, which is an important parameter in this example. The leakage inductance not only determines the regulation of the transformer, but also governs the secondary switching waveforms, and as such is preferably a highly repeatable parameter in a mass production setting.

Other implementations are within the scope of the following claims and other claims to which the applicant may be entitled.

What is claimed is:

1. An audio power amplifier comprising:
   a four-quadrant power supply having a synchronous output rectifier that includes a planar transformer;
   a first amplification unit and a second amplification unit, each amplification unit comprising:
   a switching voltage amplifier having a command signal input and an amplified signal output,
   an output filter between the amplified signal output and a load terminal,
   a current compensator with a current-compensated command signal output coupled to the command signal input of the switching voltage amplifier,
   an inner current feedback loop feeding a measurement of current measured at the output filter back to a summing input of the current compensator,
   a voltage compensator with a voltage-compensated command signal output coupled to the summing input of the current compensator, and
   an outer voltage feedback loop feeding voltage at the load terminal back to a summing input of the voltage compensator;
   a first controlled signal path from the voltage-compensated signal output of the voltage compensator of the first amplification unit to the summing input of the current compensator of the second amplification unit,
   the second amplification unit configured to use the voltage-compensated command signal of the first amplification unit as input to the current compensator of the second amplification unit in place of the voltage-compensated command signal of the second amplification unit when the first controlled signal path is activated; and
   control electronics providing signal inputs to the first and second amplification units and controlling the first controlled signal path such that the first and second amplification units are operable with separate loads, in parallel driving a common load, or across a bridge-tied-load.

2. The audio power amplifier of claim 1 wherein the first and second amplification units are operable with separate loads by each amplifying separate signals and providing the amplified signals on their separate output terminals.

3. The audio power amplifier of claim 1 wherein the first and second amplification units are operable in parallel driving a common load by each amplifying the same signal, provided from the first amplification unit to the second amplification unit via the first controlled signal path, and providing identical amplified signals on their separate output terminals, which are to be coupled to a common input terminal of the load.

4. The audio power amplifier of claim 1 wherein the first and second amplification units are operable across a bridge-tied-load by amplifying a first signal in the first amplification unit and amplifying an inverted copy of the first signal in the second amplification unit, and providing their respective amplified signals on their separate output terminals, which are to be coupled to separate input terminals of the load.

5. The audio power amplifier of claim 1 further comprising:
   a third and a fourth amplification unit substantially identical to the first and second amplification units, and a second controlled signal path from the voltage-compensated command signal output of the voltage compensator of the third amplification unit to the summing input of the current compensator of the fourth amplification unit, the control electronics further providing signal inputs to the third and fourth amplification units and controlling the second controlled signal path such that:

the third and fourth amplification units are operable with separate loads, in parallel driving a common load, or across a bridge-tied-load, and all four of the amplification units are operable together with the first and second amplification units in parallel driving a first side of a bridge-tied-load, and the third and fourth amplification units in parallel driving a second side of the bridge-tied-load.

6. The audio power amplifier of claim 5 wherein the four amplification units are operable together by:

amplifying a first signal in each of the first and second amplification units, provided from the first amplification unit to the second amplification unit via the first controlled signal path, and providing identical amplified first signals on the separate output terminals of the first amplification unit and the second amplification unit, amplifying an inverted copy of the first signal in each of the third and fourth amplification units, provided from the third amplification unit to the fourth amplification unit via the second controlled signal path, and providing identical amplified inverted first signals on the separate output terminals of the third amplification unit and the fourth amplification unit, wherein the output terminals of the first and second amplification units are to be coupled to a first input of the load, and the output terminals of the third and fourth amplification units are to be coupled to a second input of the load.

7. The audio power amplifier of claim 1 wherein the synchronous output rectifier comprises a MOSFET.

8. The audio power amplifier of claim 1 wherein the first controlled signal path comprises a switch controlled by the control electronics.

9. The audio power amplifier of claim 1 wherein the switching voltage amplifiers each comprise a modulator, a gate driver, a pair of transistors, and a pair of diodes coupled between the source and drain terminals of the transistors.

10. The audio power amplifier of claim 9 wherein the transistors comprise MOSFETS, the diodes being intrinsic to the MOSFETS.

11. The audio power amplifier of claim 1 wherein the output filter comprises an output inductor and the measured current is the current through the output inductor.

12. An audio power amplifier comprising:

a four-quadrant power supply having a synchronous output rectifier that includes a planar transformer;

a first, a second, a third, and a fourth amplification unit, each amplification unit comprising:

a switching voltage amplifier having a command signal input and an amplified signal output, an output filter between the amplified signal output and a load terminal, a current compensator with a current-compensated command signal output coupled to the command signal input of the switching voltage amplifier, an inner current feedback loop feeding a measurement of current measured at the output inductor back to a summing input of the current compensator, a voltage compensator with a voltage-compensated command signal output coupled to the summing input of the current compensator, and an outer voltage feedback loop feeding voltage at the load terminal back to a summing input of the voltage compensator;

the first and second amplification units having a first controlled signal path from the voltage-compensated command signal output of the voltage compensator of the first amplification unit to the summing input of the current compensator of the second amplification unit, the second amplification unit configured to use the voltage-compensated command signal of the first amplification unit as input to the current compensator of the second amplification unit in place of the voltage-compensated command signal of the second amplification unit when the first controlled signal path is activated;

the third and fourth amplification units having a second controlled signal path from the voltage-compensated command signal output of the voltage compensator of the third amplification unit to the summing input of the current compensator of the fourth amplification unit, the fourth amplification unit configured to use the voltage-compensated command signal of the third amplification unit as input to the current compensator of the fourth amplification unit in place of the voltage-compensated command signal of the fourth amplification unit when the second controlled signal path is activated; and control electronics providing signal inputs to each of the first, second, third and fourth amplification units and controlling the first and second controlled signal paths such that:

the first and second of the amplification units are operable with separate loads, in parallel driving a common load, or across a bridge-tied-load;

the third and fourth of the amplification units are operable with separate loads, in parallel driving a common load, or across a bridge-tied-load; and all four of the amplification units are operable together with the first and second units in parallel driving a first side of a bridge-tied-load, and the third and fourth units in parallel driving a second side of the bridge-tied-load.

13. An audio power amplifier comprising:

a four-quadrant power supply having a synchronous output rectifier that includes a planar transformer;

a first amplification unit including a switching voltage amplifier having a command signal input and an amplified signal output;

a second amplification unit that includes a switching voltage amplifier having a command signal input and an amplified signal output; and control electronics, wherein the control electronics provides signal inputs to the first and second amplification units and controls the first and second amplification units such that the first and second amplification units are operable in each of three modes, the three modes comprising:

a first mode, wherein the first amplification unit amplifies a first signal and drives a first load, and the second amplification unit amplifies a second signal and drives a second load;

a second mode, wherein
   the first amplification unit amplifies a first signal,
   the second amplification unit amplifies the first signal, and
   the amplified signal outputs of the first and second amplification units drive a single terminal of a first common load in parallel; and
a third mode, wherein
   the first amplification unit amplifies a first signal,
   the second amplification unit amplifies an inverse of the first signal, and
   the amplified signal outputs of the first and second amplification units drive opposite terminals of a common load in a bridge-tied-load configuration.

14. The audio power amplifier of claim 13 further comprising:
   a third and a fourth amplification unit substantially identical to the first and second amplification units, and
   the control electronics further providing signal inputs to the third and fourth amplification units and controlling the third and fourth amplification units such that:
      the third and fourth amplification units are operable (a) with separate respective third and fourth loads, (b) in parallel driving a single terminal of a second common load in parallel, or (c) to drive the opposite terminals of the common load in the bridge-tied-load configuration.

15. The audio power amplifier of claim 14 wherein the four amplification units are operable together by:
   amplifying a first signal in each of the first and second amplification units, provided from the first amplification unit to the second amplification unit via a first controlled signal path, and providing identical amplified first signals on separate output terminals of the first amplification unit and the second amplification unit, and
   amplifying an inverted copy of the first signal in each of the third and fourth amplification units, provided from the third amplification unit to the fourth amplification unit via a second controlled signal path, and providing identical amplified inverted first signals on separate output terminals of the third amplification unit and the fourth amplification unit.

16. The audio power amplifier of claim 15 wherein the first controlled signal path comprises a switch controlled by the control electronics.

17. The audio power amplifier of claim 13 wherein the switching voltage amplifiers each comprise a modulator, a gate driver, a pair of transistors, and a pair of diodes coupled between the source and drain terminals of the transistors.

18. The audio power amplifier of claim 17 wherein the transistors comprise MOSFETS, the diodes being intrinsic to the MOSFETS.

19. A method of amplifying audio-frequency signals comprising:
   providing a four-quadrant power supply having a synchronous output rectifier that includes a planar transformer;
   providing a first amplification unit including a switching voltage amplifier having a command signal input and an amplified signal output;
   providing control electronics that provide a signal input to the first amplification unit; and
   providing a second amplification unit,
   in each of a first and a second amplification units,
      amplifying a current-compensated command signal in a switching voltage amplifier, providing an amplified signal output,
      measuring current through an output filter between the amplified signal output of the switching voltage amplifier and a load terminal, producing a current measurement,
      feeding back the current measurement to a summing input of a current compensator via an inner current feedback loop,
      at the current compensator, comparing the current measurement to a voltage-compensated command signal and providing the current-compensated command signal to the switching voltage amplifier,
      feeding back voltage at a load terminal of the first/second amplification unit to a summing input of a voltage compensator via an outer voltage feedback loop, and
      at the voltage compensator, comparing the feedback voltage to an input command signal and providing the voltage-compensated command signal to the summing input of the current compensator;
   controlling a first controlled signal path from an output of the voltage compensator of the first amplification unit to the summing input of the current compensator of the second amplification unit, to selectively provide the voltage-compensated command signal of the first amplification unit to the summing input of the second amplification unit in place of the voltage-compensated command signal of the second amplification unit; and
   providing signal inputs to the first and second amplification units and controlling the first controlled signal path to selectively operate the first and second amplification units with separate loads, in parallel driving a common load, or across a bridge-tied-load.

20. An audio power amplifier comprising:
   a four-quadrant power supply having a synchronous output rectifier;
   a first amplification unit including a switching voltage amplifier having a command signal input and an amplified signal output;
   a second amplification unit including a switching voltage amplifier having a command signal input and an amplified signal output; and
   control electronics providing signal inputs to the first and second amplification units,
   wherein the synchronous output rectifier powers the first and second amplification units, and
   wherein the first and second amplification units are operable to amplify separate signals and to provide the amplified signals on their separate output terminals.

21. The audio power amplifier of claim 20 wherein the synchronous output rectifier includes a planar transformer.

* * * * *